United States Patent [19]  [11] 4,120,742
Asano et al.  [45] Oct. 17, 1978

[54] CAPACITANCE TYPE PICKUP STYLUS AND METHOD OF PRODUCING SAME

[75] Inventors: Akira Asano; Keiji Segawa, both of Yokohama, Japan

[73] Assignee: Victor Company of Japan, Limited, Japan

[21] Appl. No.: 736,392

[22] Filed: Oct. 28, 1976

[30] Foreign Application Priority Data

Oct. 30, 1975 [JP] Japan .................................. 50/129779

[51] Int. Cl.² .............................................. G11B 3/44
[52] U.S. Cl. .................... 156/608; 156/617 SP; 156/DIG. 61; 156/DIG. 65; 179/100.41 G; 274/38
[58] Field of Search ...................... 274/38, 37; 179/100.41 G; 156/608, 617 SP, DIG. 61, DIG. 65; 23/273 SP

[56] References Cited

U.S. PATENT DOCUMENTS

| | | | |
|---|---|---|---|
| 2,564,136 | 8/1951 | Verhegen | 274/38 |
| 3,591,348 | 7/1971 | La Belle, Jr. | 23/273 SP |
| 3,826,877 | 7/1974 | Leedom | 274/38 |
| 3,842,194 | 10/1974 | Clemens | 274/38 |
| 3,877,705 | 4/1975 | Joschko | 274/38 |
| 3,930,117 | 12/1975 | Clemens | 179/100.41 G |

*Primary Examiner*—Stephen J. Emery
*Attorney, Agent, or Firm*—Lowe, King, Price & Becker

[57] ABSTRACT

A stylus for the capacitive pickup of information signals inscribed in a recording medium as a geometrical variation comprises a corundum single crystal rod having two parallel side faces, which are inherently flat and optically smooth, and a thin electrode film coated on one of these two side faces. The electrode film is normal to the c-axis of the crystal, and the longitudinal axis of the rod coincides with one of the a-axes. The rod is formed by the "edge defined film fed growth" method, wherein corundum melt is made to spread as a film over a flat shape-defining surface and a seed crystal is pulled vertically through a capillary so that an elongated crystal is continuously grown. The c-axes of the grown and seed crystals are parallel to the shape-defining surface and normal to the growth direction. Thereby, the rod is formed without the need of machining and abrading steps, other than steps for the shaping of a tip.

6 Claims, 11 Drawing Figures

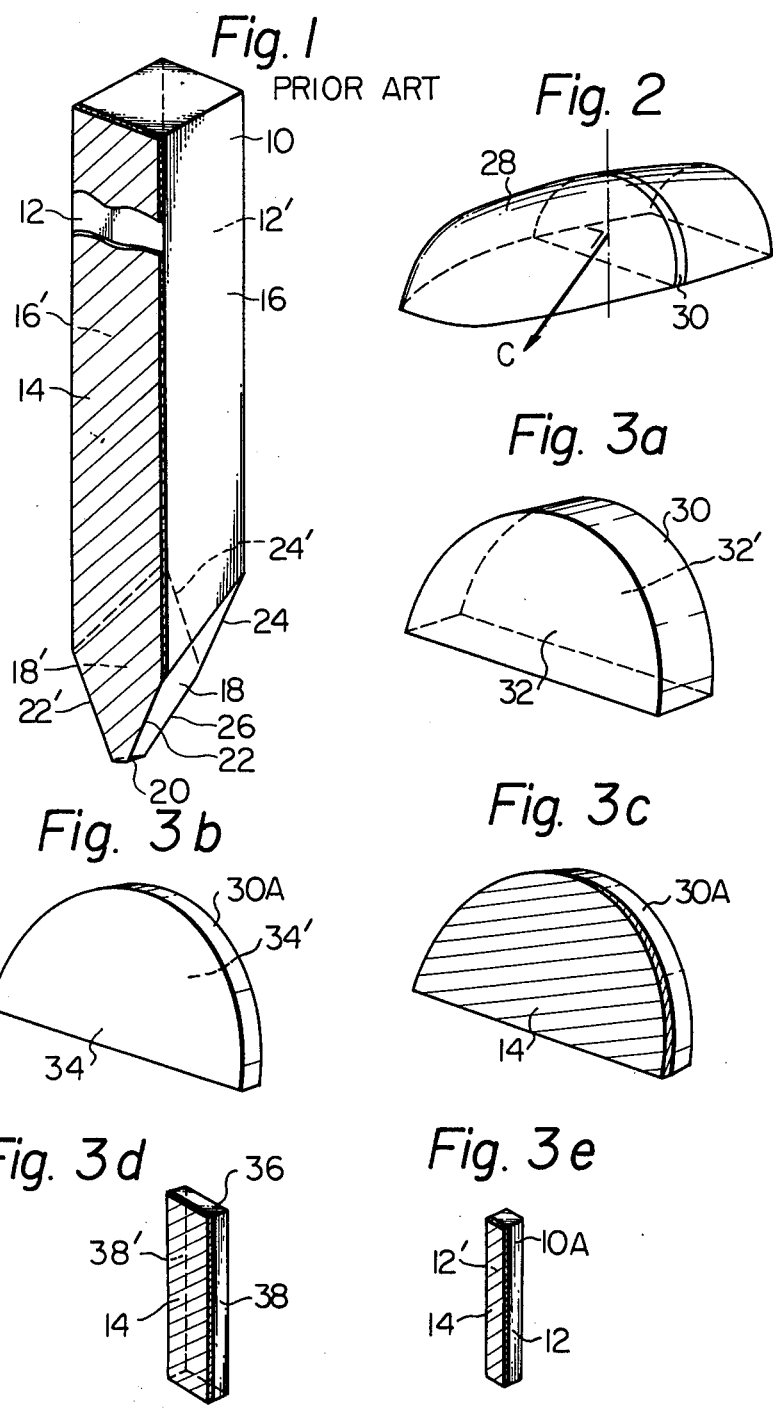

CAPACITANCE TYPE PICKUP STYLUS AND METHOD OF PRODUCING SAME

This invention relates to a method of making a pickup stylus of the capacitance type, which stylus is made of a single crystal of a hard mineral containing aluminum oxide as an essential component and has an electrode film coated on one side thereof. The stylus is useful for the pickup of information signals recorded as a variation in the geometrical configuration of grooves cut in a recording medium.

A conventional pickup stylus has the shape of a cross-sectionally rectangular rod with a suitably shaped tip and a thin electrode film coated on one side of the rod. Such stylii are used as pickups for information signals recorded as variations in the geometrical configuration as grooves cut in a recording medium by making relative scanning of the medium with the stylus and transforming the geometrical variation into a capacitance variation. The prior art stylii are usually made of a hard mineral containing aluminum oxide as an essential component typified by corundum or white sapphire (such a mineral material will hereinafter be represented by sapphire). Titanium or tantalum is most frequently used as the material of the electrode film. Typically, the stylus is about 2 mm long with a square cross section of about 0.2 × 0.2 mm, and the electrode film is about 0.10–0.15 μm thick.

The stylus is required to wear as little as possible when the stylus contacts and moves at high speed relative to a grooved recording medium, which may take the form of a disk; and hereinafter such a medium is referred to as a record disk. Also it is desired that the wear characteristic and, accordingly, the serviceable life of the stylus be accurately predictable. As another requisiste, one side of the stylus on which the electrode film is coated must be perfectly polished to provide a mirror face sans defects. In theory, these requirements can be met to satisfactorily with the prior art stylii. In practice, however, there is a significant problem because the production of high quality stylii requires a number of troublesome and costly procedures which result in a great loss of single crystal sapphire.

It is a general object of the present invention to provide a new method of making stylii of the described type with a minimum number of steps and an insignificant loss of sapphire crystal.

Prior to the description of the invention, the outline of a conventional method of producing the described stylus will be described with reference to some of the accompanying drawings.

In the drawings:

FIG. 1 is a perspective view of a conventional pickup stylus of the capacitance type;

FIG. 2 is a perspective view of a half-size ingot of sapphire as a starting material of the stylus of FIG. 1;

Figure 4:
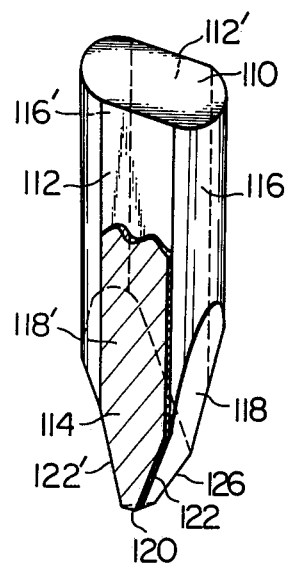
Figure 5:
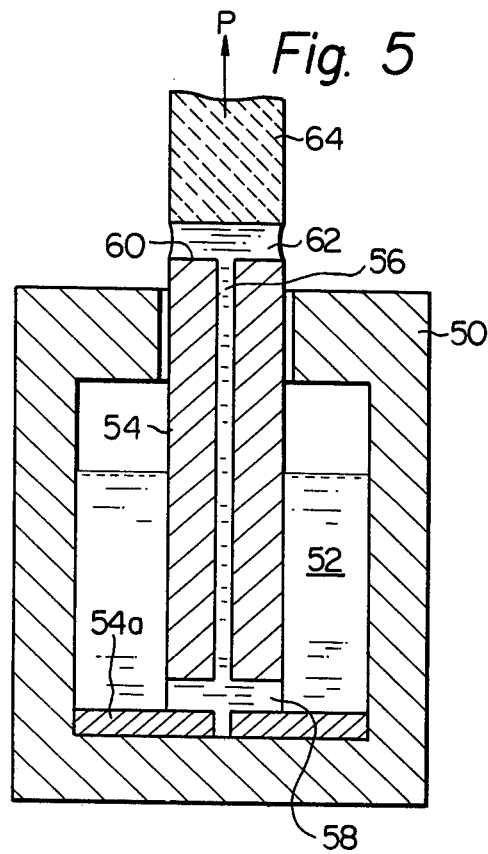
Figure 6:
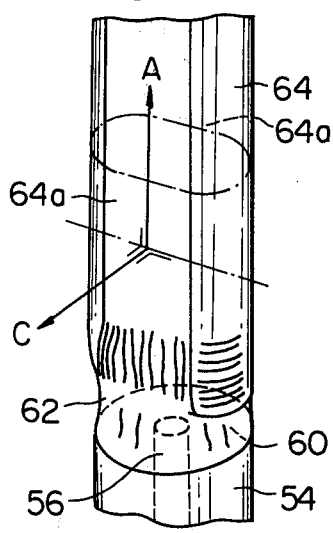
Figure 7:
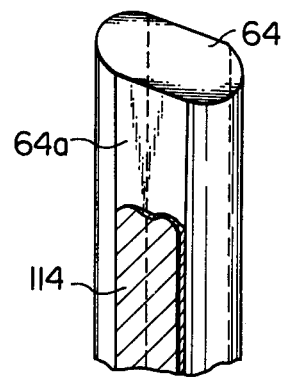

FIG. 3-a to FIG. 3-e are illustrations showing a conventional method of producing the stylus of FIG. 1 wherein an ingot of FIG. 2 is sequentially transformed into a cross sectionally square rod by sawing the ingot of FIG. 2; one side of the square rod is coated with an electrode film;

FIG. 4 is a perspective view of a pickup stylus of the capacitance type according to the invention;

FIG. 5 is a sectional view in elevation of an assembly of a crucible and a shaping member employed in the present invention for growing sapphire single crystal;

FIG. 6 is an illustration showing growth of a rod-shaped single crystal of sapphire by the use of the assembly of FIG. 5; and FIG. 7 is a fragmentary, perspective view of a rod-shaped single sapphire crystal at a stage after the a side face of the rod has been coated with an electrode film in a production method according to the invention.

A conventional capacitance type pickup stylus of FIG. 1 is made of single crystal of sapphire and has fundamentally the geometry of a rod having a length about 2 mm, with a square cross section of about 0.2 × 0.2 mm perpendicular to its longitudinal axis to form four sides. One side 12 of the square rod 10 is entirely coated with a thin (about 0.10–0.15 μm) electrode film 14, which is formed by the deposition of, for example, titanium or tantalum on the side face 12; deposition is with a vacuum evaporation or a sputtering technique. An end portion of the rod 10 is shaped as a wedge to serve as the stylus tip for tracing the grooves in record disks. Two parallel sides 16 and 16' which are located adjacent and perpendicular to side 12 are chipped obliquely and symmetrically with respect to one another such that both of sides 12 and 12' have generally triangular end portions. Strictly speaking, the tip of this stylus is not sharp-edged but is formed as an isosceles triangle face 20 in a plane perpendicular to the longitudinal axis of the square rod 10; the base of the triangle is on side face 12. Triangle face 20 has a very small area (the base on the side face 12 is only about 2 μm long; in the drawings triangular face 20 is illustrated in an exaggerated size) and is formed to allow the stylus to make face-to-face contact with the grooves of the record disks, thereby to avoid the application of destructively high loads to the record disk. The thus shaped tip of the stylus is also effective in dispersing dust which tends to accumulate in the record grooves and to disturb a stable pickup of the recorded signals. The triangular face 20 result by forming the wedge portion in the following manner.

The chipped portions of the two sides 16 and 16' provide two reversely inclined and generally rectangular planes or surfaces 18 and 18', respectively. The surface 18 intersects the side face 12 to form ridge 22, while the intersection of the surface 18' and the side face 12 provides another ridge 22'. These ridges 22 and 22' form an angle of about 40°–50° relative to the rod longitudinal axes and intersect with each other on the side face 12 at a short distance from the original end face of the square rod 10. Another pair of ridges 24 and 24', which are formed by the intersection of the two inclined surfaces 18, 18' and the side face 12', intersect with each other on the side face 12' at a distance from the original end face of the square rod 10. This distance is longer than the distance of the above described intersection on the side face 12 from the end face. The intersection of the two inclined surfaces 18 and 18' forms a ridge 26 which terminates at one end on the side face 12 and at the other end on the side face 12' and extends at an angle of about 50°–70° with the side face 12. Then, the thus sharpened end is cut by a plane perpendicular to the longitudinal axis of the square rod at a short distance from the intersection of the ridge 26 and the side face 12 to form the triangular tip face 20 of the stylus. The stylus is brought into contact with a record disk such that the electrode film 14 is approximately vertical to the disk. The ridge 26, therefore, forms an angle of about 20°–40° with the disk. Since the stylus relative movement to the disk with the side 16' forward, the 20°–40° angle between the ridge 26 and the disk corresponds to the introduction angle at the pickup.

At present, the square rod 10 for the stylus of FIG. 1 is produced from an ingot 28 of single crystal of sapphire. The ingot 28 is produced by a flame fusion growth technique which is commonly called the Verneuil process. Usually a single crystal ingot produced by the Verneuil process has a circular cross section normal to the direction of the crystal growth. However, the cylindrical ingot is liable to split longitudinally into two semicircular cross-sectional halves due to internal distortions developed during the growth. The splitting can be prevented by subjecting the ingot to a long annealing procedure in a furnace accompanied by a rise in the price of the ingot. Accordingly, the semicircular cross-sectional half-size ingot 28 of FIG. 2 is commonly employed in the production of the described pickup stylus.

It is known that a single crystal mass, for example of sapphire, exhibits an anisotropy wear characteristic with respect to the crystal axes. In general, the best wear resistance exhibited by the mass in a certain direction is tens of times higher than worst wear resistance exhibited in a most unfavorable direction.

Sapphire or corundum is a hexagonal system. The sapphire single crystal stylus of FIG. 1 exhibits best wear resistance when the longitudinal axis of the single crystal rod 10 and the three $a$-axes of the sapphire crystal are in the same plane (accordingly the longitudinal axis of the rod 10 is perpendicular to the principal axis or $c$-axis of the crystal) if the stylus is contacted with the record disk at a right angle. However, the angular relationship between the axes of the sapphire ingot 28 and the crystal axes is not quite definite. For example, the $c$-axis of the crystal indicated by the arrow C in FIG. 2 is oblique to the longitudinal axis of the ingot 28, and the angle between the $c$-axis and the longitudinal axis of the ingot 28 is specific to each ingot 28. For a number of industrially produced ingots 28, this angle scatters varies by about 30°. It is necessary, therefore, to examine the direction of, for example, the $c$-axis in the ingot 28 by a suitable technique, such as by the use of X-ray diffraction prior to the ingot being machined. The examined ingot 28 must be fixedly mounted on a three-axis goniometer to adjust the angular relationship between the ingot 28 and the blade of a slicing machine.

Then the ingot 28 is sliced to form generally semicircular plates 30 as shown in FIG. 3-a. To produce the 0.2 mm square rod 10, the semicircular plate 30 should have a thickness of about 0.5–0.8 mm. Since the cut faces 32 and 32' of the plate 30 are not smooth and even have saw marks and scratches on them, faces 32, 32' are polished thoroughly and carefully to form a semicircular plate 30A of FIG. 3-b which is about 0.2 mm thick and has two mirror-finished or optically smooth end faces 34 and 34'. If it is known in advance that electrode film 14 is to be definitely formed on one of the two faces 34, 34', the other face 34 or 34' may be left unpolished.

Then titanium or tantalum is deposited on one of the mirror faces 34, 34' by the above described technique to entirely coat this face 34 or 34' with the electrode film 14 of a 0.10–0.15 μm thickness as shown in FIG. 3-c. It is very important for electrode film 14 to be formed on a perfectly even and smooth surface to have and a uniform thickness. When the stylus transduces recorded signals a capacitance is developed between electrode film 14, having of a definite thickness, and the and uneven geometry on the record disk. If the side face 12 has depressions such as scratches, the electrode film 14, when deposited, fills such depressions and accordingly becomes irregularly thick. Then the stylus cannot faithfully pick up the recorded signals. Thereafter the semicircular plate 30A with the electrode film 14 is sliced to form strips 36, shown in FIG. 3-d, having a rectangular cross section normal to the electrode film 14. Utmost care must be taken to prevent breakage or cleavage of sapphire plate 30A during slicing. It is intended to produce a 0.2 mm square rod 10. However the strip 36 must have a width of about 0.5–0.8 mm (the thickness is about 0.2 mm) since the stress during slicing becomes greater than the resistance of the sapphire plate 34 to cleavage if an attempt is made to make the width of the strip 36 smaller than about 0.5 mm. If it is desired for the longitudinal axis of the strip 36 to have a definite angular relationship between the $a$-axes of the sapphire crystal, the semicircular plate 30A must be examined to determine the direction of the $a$-axes before the deposition of the electrode film 14.

The sliced faces 38 and 38' of the strip 36 are neither smooth nor perfectly flat. Besides, a width of strip 36 more than 0.5 mm is quite unfavorable to the cost of subsequent abrading work that shapes inclined surfaces 18 and 18' to the stylus tips. These faces 38 and 38', therefore, are abraded until the width of the strip 36 decreases uniformly to about 0.2 mm and there is a perpendicular intersection between adjacent ones of each of four sides of a resultant square rod 10A, shown in FIG. 3-e. The two sides faces 12 and 12', which are formed by abrading the sliced faces 38, 38' of the strip 36, of the square rod 10A need not be optically smooth, so that the abrading work on the faces 38, 38' need not to include a polishing step.

The thus obtained rod 10A is cut into several pieces each having a length of about 2 mm, for example. Each of these pieces is the square rod 10 in FIG. 1. To form one end portion of the rod 10 into the wedge shape as shown in FIG. 1, the rod 10 is fixed at the other end portion to a shank of an abrading machine. In the illustrated stylus, the ridge 26 must be free from defects, such as notches, at least in the neighborhood of the triangular face 20 since the presence of such defects causes the accumulation of dust, resulting in a lowering of the quality of the picked up signals. To prevent defection in ridge 26, the inclined surfaces 18 and 18' must be made almost optically smooth. The presence of scratches on these surfaces 18, 18' is liable to cause the presence of notches on the ridge 26. The smoothness of the surfaces 18, 18' should be such that no scratch can be observed with an optical microscope of about 1000 magnification. The abrading step for forming these surfaces 18, 18', therefore, needs to include a polishing step at the last stage. It is preferable from the viewpoint of reducing the cost of this abrading work for rod 10 to be as thin as possible. On the other hand, the rod 10 must be thick enough to provide sufficient physical strength. The cross section of about 0.2 mm square is determined from these two angles.

After the completion of the abrading work that forms inclined surfaces 18, 18' and the ridge 26, the rod 10 is attached at its unworked end at a predetermined angle to a cantilever, having sufficient mobility for stable tracing of the grooves on the record disk. A final abrading step to form triangular face 20 on the stylus is preferably carried out with the rod 10 supported by the cantilever. Since the triangular face 20 has only a very small area, it is necessary to abrade only a very small volume of sapphire surfaces to provide the triangular face 20. Accordingly, the abrasion can easily be accomplished by a light load lapping step on the sharpened end of the rod 10 using diamond powder after the rod 10 has been mounted on the cantilever.

The above described conventional method for the production of a capacitance type pickup stylus and the product formed by the method include various disadvantages, summarized as follows.

(1) The production method includes many machining and abrading steps, and various examination and inspection procedures are needed during the production. Accordingly the cost of production is great.

(2) Only a fractional portion of a sapphire ingot can actually be utilized: more than 95% of the ingot is wasted as scraps and dust during the machining and abrading steps, and a considerable number of defective products are formed by the respective steps.

(3) The method requires various types of machines and consumes large quantities of expendables, such as abrading materials.

(4) Mass-produced styli do not have uniform wear characteristics or serviceable life because the variation in the angular relationship between the longitudinal axis of the individual stylus and the c-axis of the crystal cannot practically be made less than about ± 5°.

An object of the present invention is to provide a relatively inexpensive sapphire pickup stylus of the capacitance type, having a long, uniform serviceable life, even when mass-produced.

Another object of the invention is to provide a method of producing a pickup stylus having the above described features, which method has advantages over the above described conventional method because the total number of the machining and abrading steps is greatly lessened and only a minor portion of a monocrystalline sapphire starting material is wasted during the production of the stylus.

A pick-up stylus according to the invention comprises: a rod of a single crystal of a hard mineral containing as an essential component aluminum oxide; the rod has an inherently flat and optically smooth side face parallel to the longitudinal axis of the rod and normal to the principal axis of the crystal, and a thin electrode film intimately coated on this side face.

The rod is produced by a so-called "edge defined film fed growth" method, wherein melt of the hard mineral spreads as a film over a flat, and substantially circular shape-defining surface through a capillary. Then a elongate crystal is continuously grown from the melt by vertically pulling up the film with a seed crystal of the hard material. The seed crystal is oriented such that an a-axis thereof coincides with the pull up direction and the c-axis is normal to the pull up direction. Two parallel side faces which are inherently flat and optically smooth are spontaneously formed on the thus grown rod parallel to the growth direction and normal to the principal axis of the crystal even thought the shape-defining surface has a circular periphery.

The pickup stylus is produced by coating at least one of these flat side faces with the electrode film, cutting the rod into a desired length and shaping an end portion of the cut rod to provide a shaped tip to the stylus.

The stylus according to the invention exhibits excellent and constant resistance to wear. The production method according to the invention has a primary advantage of eliminating machining and abrading step in preparation for the formation of the electrode film.

The invention will fully be understood from the following detailed description of a preferred embodiment with reference to the accompanying drawings.

FIG. 4 shows is an illustration of a pickup stylus of the capacitance type according to the invention. In principle, this pickup stylus does not differ from the conventional pickup stylus of FIG. 1. The stylus of FIG. 4 consists of a rod 110 of sapphire single crystal and a thin electrode film 114 coated on a side face 112 of the rod 110. An end portion of this stylus is wedge-shaped like the stylus of FIG. 1 to provide a triangular face 120 having a very small area at the tip of the stylus. In appearance, a fundamental difference between the stylii of FIGS. 1–4 resides in the plan view geometry of the sapphire rod 110. The cross section of the rod 110 is not square or rectangular but is nearly circular or elliptical although a portion of the periphery is define by two parallel straight line segments or chords. In other words, the rod 110 has two parallel and flat side faces 112 and 112' and two substantially symmetrical and clyindrical faces 116 and 116' respectively spanning between the two flat side faces 112 and 112'. The curved faces 116 and 116' are respectively two symmetrical portions of the side of an elliptic cylinder interposing the major axis of the ellipse therebetween. The two flat side faces 112 and 112' are both parallel to a plane including the major axis of the ellipse and the longitudinal axis of the rod 110 and, accordingly, have substantially the same width. Although omitted from the illustration, an end portion reverse to the abraded tip of the rod 110 may be shaped differently to enable the stylus to be attached to either the shank of an abrading machine or a cantilever which supports the stylus.

The stylus of FIG. 4 is usually about 2 mm long. In cross section of the rod 110, the width in the direction parallel to the flat faces 112, 112' is about 0.2–0.3 mm, while the width in the direction perpendicular to the flat faces 112, 112' is about 0.15 mm when the aforementioned width is about 0.2 mm but may increase up to about 0.25 mm when the firstly mentioned width is as large as about 0.3 mm. Each of the flat faces 112, 112' is about 0.05–0.1 mm in width. The electrode film 114 is formed on either of the two flat side faces 112 and 112' and is identical with the electrode film 14 of the stylus of FIG. 1 with regard to the type of material, thickness and deposition method. In the wedge-shaped portion, the angle between two ridges 122 and 122'(respectively formed by the intersection of the side face 122 and inclined surfaces 118 and 118'), the angle between a ridge 126 (intersection of the two surfaces 118 and 118') and the side face 112, and the area of the triangular face 120 are substantially the same as in the conventional stylus of FIG. 1.

An essential difference of the stylus of FIG. 4 from that of FIG. 1 resides in the origin of the sapphire rod 110. According to the invention, the rod 110 is not produced by machining a sapphire ingot but is originally grown as a rod with the above described plan view geometry by a specific growth method as will hereinafter be described. The flat side face 112 is not subjected to any abrading procedure in preparation for the deposition of electrode film 114 thereto. Besides, the side face 112 is normal to the c-axis of the sapphire crystal, and the longitudinal axis of the rod 110 coincides with one of the three a-axes of the crystal.

In the present invention, sapphire single crystal is grown continuously in the form of a thin rod have a uniform cross section of a predetermined shape, i.e. the cross-sectional shape of the rod 110, by a so-called "edge defined film fed growth" method that is described in U.S. Pat. No. 3,591,348. The outline of this growth method is described with reference to FIGS. 5 and 6.

A crucible 50 placed in a furnace (not shown) contains therein melt material 52 such as alumina or sapphire. Molybdenum or its alloy is usually employed as the material of the crucible 50. A cylindrical shaping member 54 is vertically disposed in the cruicible 50 with its flanged base 54a resting on the bottom of the crucible 50. The shaping member 54 has an axial bore 56, sized to function as a capillary, and one or more radial holes 58 near the base 54a to permit inflow of the melt 52 into the axial bore 56. The material of shaping member 54 is required to well be easily wettable with the melt 52. Molybdenum or its alloy is suitable for the growth of sapphire. The upper end of the shaping member 54 protrudes from the crucible 50 and terminates in a flat surface 60 which intersects the outer surface of the shaping member 54 at a right angle. The periphery of this flat surface 60 has substantially the same shape and size as a crystal rod which is to be grown by this method. (In the present invention, the rod 110 of FIG. 4 is not fully cylindrical, but the surface 60 is made circular for a reason that will later be explained.) A conventional crystal-pulling mechanism (not shown) is provided to move a pulling rod (not shown) upwardly and vertically to the surface 60.

In operation, a sapphire seed crystal (not shown) is mounted in a holder extending from the lower end of the pulling rod. The lower end of the seed crystal is small enough in cross section to be inserted into the upper end of the capillary 56. In the present invention, it is necessary for the seed crystal to be precisely oriented such that the $c$-axis is perpendicular to the direction of the crystal-pulling. Preferably, one of the three $a$-axes is made to coincide with the pulling direction. The melt 52 is maintained in completely liquid state. Then the melt 52 rises in and fills the capillary 56 as a column. The column rises until its meniscus is substantially flush with the upper end surface 60 of the shaping member 54. Thereafter the seed crystal is moved into contact with the meniscus of the sapphire column in the capillary 56. After a while, the seed crystal is slowly withdrawn at a predetermined rate. As the seed crystal is slowly withdrawn, the affinity of the melt 52 with respect to the newly grown sapphire on the seed crystal causes the melt to spread out from the capillary 56 onto the end surface 60 as a film (indicated at 62) whose geometry is defined by the outer edge of the end surface 60.

This film 62 functions as a growth pool of the melt 52. As the film 62 spreads out to the edge of the surface 60, the growth also expands horizontally. At an appropriately determined pulling speed, growth propagates vertically throughout the entire horizontal expanse of the film 62, with the result that the diameter of the growing cylindrical crystalline body indicated at 64 becomes substantially the same as that of the surface 60. To realize a continuous growth of the elongate body 64 with a constant cross section, it is important for the diameter of the capillary 56, the temperature of the melt 52, the size of the surface 60 and the pulling speed be appropriately determined and all balance each other as described in the U.S. Pat. No. 3,591,348. It is necessary for the melt 52 to be supplied to the surface 60 to balance with the amount of heat of crystallization released from the film 62 and that the grown body 64 is pulled so as not to break the film 62.

We have found that, when a sapphire body is grown by the above described growth method using the shaping member 54 having a circular upper end face 60 and by orienting a seed crystal in the above described manner, that the outer surface of the grown body 64 is not perfectly cylindrical but includes two parallel and flat side faces 64a as shown in FIG. 6. As the result, the plan view geometry of the grown body 64 resembles an ellipse as described hereinbefore with reference to FIG. 4. These two flat faces 64a are parallel to the longitudinal axis of the elongate body 64 with a spacing less than the diameter of the shape-defined surface 60 therebetween. It is a favorable fact that these flat faces 64a are always formed normal to the $c$-axis (indicated by the arrow C in FIG. 6) of the grown sapphire 64 so long as the $c$-axis of the seed crystal is oriented to be normal to the direction of the pulling (indicated by the arrow P) and, hence, the pulling direction P is in a plane including the three-$a$-axes (the arrows A) of the seed crystal and the grown crystal 64. Each of these flat faces 64a, therefore, is crystallographically a $c$-plane or 0001 plane. The reason why faces 64a are flat has not yet been confirmed but is presumably attributable, at least partly, to a difference in the surface tension at the crystallization of the melt 52 between the plane and the other planes. The flat faces 64a are considered to result from a compensation for such energy unbalance.

These flat faces 64a are quite even and optically smooth. Since these faces 64a are crystallographical planes formed by an orderly disposition of atoms constituting sapphire, the surface roughness of these faces 64a is on the order of the size of the molecules constituting the crystal and below 0.01 μm. Besides, these faces 64a involve no defects such as scratches, crystallographically dislocated regions and work-hardened regions because these faces 64a are provided through no machinning or abrading work. Accordingly, these faces 64a are quite suitable for use as a flat side face, for example the side face 112 in FIG. 4, to be coated with an electrode film in a capacitance type pickup stylus. The width of these flat faces 64a in a plane parallel to the $c$-axis is variable depending on the growth conditions but can be made to range from about one-quarter to about one-third of the diameter of the shape-defining surface 60. To utilize the grown body 64 as the rod 110 of the pickup stylus of FIG. 4, the width of the flat faces 64a is desired to be about 0.05–0.1 mm at the narrowest for accomplishing the abrading works to form the wedge-shaped portion. Accordingly a practically sufficient width is realized when the grown body 64 has a fundamental diameter or major axis in cross section of about 0.2–0.3 mm.

In growing the elongate sapphire body 64 as the material of the pickup stylus, one of the $a$-axes of the seed crystal is arranged to coincide with the pulling direction P because the flat faces 64a tend to exhibit a terrace-like undulation when the $a$-axes are oriented otherwise. Such undulation is probably attributable to a nonuniformity or instability in the compensation for the aforementioned energy unbalance. The growth as illustrated in FIGS. 5 and 6 must be carried out while avoiding any mechanical vibration of the film 62. If film 62 vibrates as the crystal is grown, microscopic facets tend to appear on the flat faces 64a and/or the plan view geometry of the grown body 64 exhibits a periodic fluctuation. Since the grown body 64 is a very thin rod, the influence of the vibration is significant even though the vibration is of a very small amplitude. Accordingly, the heating and pulling mechanisms for the growth must be designed so as not to transmit vibrations to the film 62 and the growth apparatus must be made insusceptible to external vibrations. The temperature of the film 62 on the shape-defining surface 60 must be kept constant. If this temperature fluctuates, the cross-sectional size of the grown body 64 exhibits a periodic variation and, besides, the width of the flat faces 64a fluctuates significantly even though the pulling speed is kept constant. The shaping member 54, therefore, should be made to have a sufficiently large heat capacity, and a relatively high temperature atmosphere should be established around the film 62.

The use of the thus grown sapphire body 64 as the rod 110 in the pickup stylus of FIG. 4 has the further advantage of the resultant stylus exhibiting an excellent and predictable wear resistance. As mentioned hereinbefore, the sapphire rod 110 exhibits a minimal wear when the c-axis of the sapphire rod 110 is exactly normal to the electrode film 114 and parallel to the record disk. According to our experiments, the wear resistance of the rod 110 with such orientation of the c-axis is more than four times better than that in the case of the c-axis being at 60° with the electrode film 114. It is very important for the stylus to have a good and uniform wear resistance. Since the stylus moves at a high speed movement relative to a record disk in which information signals are inscribed with high density, for example with geometrical intervals of a few microns. It has not been found to what extent the wear characteristic of the rod 110 is influenced by the orientation of the a-axes. It is doubtless, however, that the coincidence of one of the a-axes with the longitudinal axis of the rod 110 is favorable to render the wear characteristic of the rod 110 almost definite. The rod-shaped sapphire body 64 of FIG. 6 can be obtained with constant cross-sectional shape and size together with a definite crystal axes orientation even in mass production. Since the rod 110 for the stylus of FIG. 4 is produced essentially by cutting the rod-shaped sapphire body 64 crosswise, mass-produced rods 110 are quite uniform not only in the cross-sectional shape and size but also in the directions of the c-axis and a-axes. Consequently, the mass-produced rods 110 have a uniform wear characteristic, i.e., a uniform and predictable serviceable life. In the conventional method (shown in FIG. 3-a to FIG. 3-e) of producing the rod 10, it is industrially impossible to make the scatter of the directions of the crystal axes less than about ±5°.

The electrode film 114 is formed on one of the flat faces 64a of the rod-shaped sapphire body 64 as shown in FIG. 7 either before or after the cutting of the sapphire body 64 into a plurality of about 2 mm long rods 110 in FIG. 4. The method of forming the electrode film 114 is the same as in the production of the conventional stylus of FIG. 1. To realize a uniform thickness of the electrode film 114, the flat face 64a should be arranged exactly parallel to, for example, the cathode of a sputtering apparatus. The length of the body 64 at the sputtering should be large enough to avoid the utilization of extreme end portions of the cathode. It is permissible to coat the entire side face of the rod-shaped sapphire body 64 with the electrode film 114 if desired.

After the electrode film 114 is formed, the sapphire body 64 or the cut rod 110 is subjected to the abrading steps to form the wedge-shaped end portion as shown in FIG. 4. (When the electrode film 114 is formed before cutting the sapphire body 64 into the about 2 mm long rods 10, the body 64 may be cut in advance of the abrading works but may alternatively be subjected to sequential steps of forming the wedge-shaped portion at one end and then cutting to separate one stylus rod 110.) In the stylus of FIG. 4, the wedge-shaped portion is the same as that in FIG. 1. Two inclined surfaces 118, 118' are formed by the abrading works to give a ridge 126 (which forms an angle of about 50°–70° with the electrode film 114) as the intersection thereof. The sharpened end of the rod 110 is abraded to form a microscopically triangular tip face 120. The illustrated wedge shape is merely exemplary: the stylus may be made to have a differently shaped tip portion.

The stylus production method according to the invention has the following advantages over the conventional method which uses a sapphire ingot prepared by the Verneuil process as the starting material. (1) There is no need to examine the directions of the crystal axes before and during the course of the production. (2) Most of the machinning and abrading steps included in the conventional method become unnecessary. (3) Inspection costs during the production are greatly reduced as the result of the elimination of many machining and abrading steps. (4) Since the flat side face 112 or 112' to be coated with the electrode film 114 is spontaneously obtained (without performing any abrading or polishing work), there is no fear of damaging or degrading the flat face 112 or 112' by abrading. (5) The production can be accomplished by the use of fewer machines and with less consumption of expendables. (6) The amount of the wasted portion of sapphire is greatly decreased: about 70–80% of the sapphire body 64 actually turns into the stylus rods 110. (7) In addition to the above advantages which all lead to the reduction of production costs, there is practically no restriction to the length of either the stylus as the product or the sapphire body 64 at the abrading stage for forming the wedge-shaped portion.

The cross-sectional shape of the stylus rod 110 is not necessarily fundamentally circular or elliptical as shown in FIG. 4 or square as in FIG. 1 so long as the flat side face 112 is realized. However, the shaping member 54 (and hence the rod 110) is preferably circular cylindrical as herein described because of practical difficulty in the fabrication of a very thin shaping member in a different shape. To reduce the growth costs, it is possible to dispose a plurality of the shaping member 54 in a single crucible 50 and carry out the growth simultaneously for every shaping members.

What is claimed is:

1. A method of producing a pickup stylus of the capacitance type having a shaped tip for tracking and a flat side face with an electrode film coated thereon for the pickup of information signals, inscribed in a recording medium as geometric variations of a track, as variations in the capacitance between the recording medium and the stylus upon relative movement on the track, the method comprising the steps of:

growing by a modified edge defined film fed growth technique a single crystal of a hard mineral of a hexagonal system containing as an essential component aluminum oxide in the form of an elongated body having a substantially constant cross section; said modified edge defined film fed growth technique including the steps of (a) spreading a melt of said hard mineral as a film over a flat and circular surface through a capillary, the circular surface having a cross-sectional diameter no greater than about 0.3 mm and determining, but differing from the cross-sectional shape of the grown crystal, and (b) continuously growing said elongated body from said melt by vertically pulling up said film through the surface with a seed crystal of said hard mineral, said seed crystal being oriented such that an $a$-axis of said seed crystal coincides with the direction of the pullup of said seed crystal, whereby the longitudinal axis of said elongated body coincides with said $a$-axis of said single crystal and said elongated body has a pair of inherently flat and smooth side faces both parallel to said longitudinal axis and normal to the $c$-axis of said single crystal, so that said cross section is defined by a pair of parallel straight lines with a spacing less than the diameter of said circular surface and a pair of outwardly convex arcs generally conforming to the edge of said circular surface;

on at least one of said flat and smooth side faces, forming a thin electrode film in intimate contact with the side face; and shaping an end portion of said elongate body with said electrode film thereon such that the shaped end portion serves as the tip of the stylus.

2. A method as claimed in claim 1, wherein said hard mineral is corundum.

3. A method as claimed in claim 2, wherein said end portion is so shaped as to form a generally wedge-shaped portion, the edge of the wedge being inclined with respect to said electrode film and in a plane normal to said electrode film, said edge terminating at a short distance from said electrode film to form a small and generally triangular flat face at the tip of the stylus with the base of the triangle on said electrode film, so that said generally triangular flat face is normal to said longitudinal axis and can slide on the recording medium when the stylus traces the track.

4. A method as claimed in claim 2, wherein the material of said electrode film is selected from the group consisting of titanium and tantalum.

5. A method as claimed in claim 4, wherein said electrode film is formed by a sputtering technique.

6. A method as claimed in claim 4, wherein said electrode film is formed by a vacuum evaporation technique.